United States Patent [19]

Fukuda

[11] Patent Number: 4,564,280

[45] Date of Patent: Jan. 14, 1986

[54] METHOD AND APPARATUS FOR DEVELOPING RESIST FILM INCLUDING A MOVABLE NOZZLE ARM

[75] Inventor: Yuji Fukuda, Yokohama, Japan

[73] Assignee: Fujitsu Limited, Kawasaki, Japan

[21] Appl. No.: 545,329

[22] Filed: Oct. 25, 1983

[30] Foreign Application Priority Data

Oct. 28, 1982 [JP] Japan ............................. 57-190250
Oct. 28, 1982 [JP] Japan ............................. 57-190252

[51] Int. Cl.⁴ .......................... G03D 5/04; B08B 3/02
[52] U.S. Cl. ................................. 354/317; 354/325; 134/144; 134/153; 118/321
[58] Field of Search ................ 354/317, 324, 325; 134/140, 144, 148, 153; 118/321, 320, 52, 54; 427/240, 425

[56] References Cited

U.S. PATENT DOCUMENTS 2,376,591 10/1945 Campbell .
3,769,992 11/1973 Wallestad ............................ 134/144
4,416,213 11/1983 Sakiya .................................. 118/321

FOREIGN PATENT DOCUMENTS 451209 10/1927 Fed. Rep. of Germany .
1267979 11/1968 Fed. Rep. of Germany .
2746519 4/1978 Fed. Rep. of Germany .
54-102123 11/1979 Japan ................................... 354/325
55-46985 2/1982 Japan .
57-166032 10/1982 Japan ................................... 354/325

OTHER PUBLICATIONS

Patents Abstracts of Japan, vol. 6, No. 100 (P-121) (1978) Jun. 9, 1982.
Patents Abstracts of Japan, vol. 5, No. 110 (P-71) (782) Jul. 17, 1981.
Patents Abstracts of Japan, vol. 7, No. 90 (P-191) (1235), Apr. 14, 1983.
Patents Abstracts of Japan, vol. 7, No. 41 (P-177) (1187), Feb. 19, 1983.

Primary Examiner—A. A. Mathews
Attorney, Agent, or Firm—Armstrong, Nikaido, Marmelstein & Kubovcik

[57] ABSTRACT

An apparatus for developing a resist film coated on a rotatable base plate, comprising means for supporting and rotating the base plate and nozzle means for feeding a developer onto the resist film. The nozzle means comprises a nozzle arm extending over the base plate and having a plurality of nozzles arranged along the length of the nozzle arm. Disclosed also is a method for developing a resist film coated on a rotatable base plate with a developer fed from a plurality of nozzles arranged on a nozzle arm along the length of the nozzle arm. The method comprises feeding the developer from th respective nozzles onto the resist film while rotating the base plate and while scanning the nozzle arm over the resist film.

11 Claims, 5 Drawing Figures

METHOD AND APPARATUS FOR DEVELOPING RESIST FILM INCLUDING A MOVABLE NOZZLE ARM

BACKGROUND OF THE INVENTION

1. Field of the Invention

This invention relates to an apparatus for developing a resist film, in particular to an apparatus for feeding a developer onto a resist film, and to a method for effecting the same.

2. Description of the Prior Art

In the field of fine precision processing, particularly in the process of manufacturing a semiconductor integrated circuit, it is often necessary to coat a base plate, such as a silicon wafer, with resist, such as photoresist, to form a photoresist film thereon and then subject it to exposure to provide a photoresist film having a predetermined photosensitive pattern. Next, the exposed photoresist film having a predetermined pattern is developed with a developer, such as an organic alkaline solution, and the rest of the resist film is removed to form a predetermined pattern of photoresist film on the base plate. The photoresist film thus obtained is used, for example, as a photomask to etch the base plate, as is well known.

Recently, in view of high-speed processing and economic factors, there has been a demand for a high-integration photoresist pattern. In order to satisfy this demand, it is necessary to provide a uniform and smooth photoresist film and to decrease or eliminate unevenness or irregularity in developing. There are known two methods of developing photoresist film, one being a paddle method in which a developer is dropped onto the photoresist film coated on the base plate of the semiconductor and the other being a spray method in which a developer is sprayed onto the photoresist film in the form of a mist with a spray nozzle.

However, the paddle method has a disadvantage in that it requires a large amount of developer and a considerable amount of time for developing, particularly in the case of positive developing. Also, the paddle method has a grave disadvantage in that the developing tends to be nonuniform. The reason for this is that the developing is begun near the center of the resist film (i.e., the base plate) and progresses toward the periphery of the resist film, in view of a difference in surface area between the center portion and the peripheral portion of the resist film. Namely, since the surface area of the peripheral portion is somewhat larger than that of the center portion, the center portion is overdeveloped when the developing of the peripheral portion is completed. Overdeveloping of the center portion renders the thickness of and the width of the photoresist pattern near the center of the base plate smaller than that near the peripheral portion, with the result that a predetermined desired photoresist pattern cannot be formed on the base plate.

On the other hand, in the spray method, the developer is sprayed from a spray nozzle having a predetermined spread angle so as to form a developer mist spreading, for example, in a conical form. Therefore, the spray method does not have the disadvantage of requiring a large amount of developer and a considerable amount of time for developing. However, the spray method has a disadvantage in that the thickness of the photoresist pattern formed on the base plate is uneven. Namely, bank-like ridges are formed on the peripheral portion of the resist film and result in irregularity of developing.

SUMMARY OF THE INVENTION

The primary object of the present invention is, therefore, to provide an apparatus and method for developing a resist film (e.g., a photoresist film) by which a stable and uniform resist film pattern, free from the above-mentioned disadvantages of the prior art, can be produced.

In order to achieve the object of the invention, according to the present invention, there is provided an apparatus for developing a resist film coated on a rotatable base plate, the apparatus comprising means for rotatably supporting the base plate, means for rotating the base plate, and nozzle means for feeding a developer onto the resist film, the nozzle means comprising a nozzle arm which extends over the base plate and which has a plurality of nozzles arranged along the length of the nozzle arm.

Preferably, there is provided means for moving the nozzle arm between the axis of rotation of the base plate and the periphery thereof.

Furthermore, preferably, there is provided means for independently controlling the amount of developer fed from the respective nozzles.

According to another aspect of the present invention, there is provided a method for developing a resist film coated on a rotatable base plate with a developer which is fed from a plurality of nozzles arranged on a nozzle arm along the length of the nozzle arm, the nozzle arm extending over the resist film, the method comprising feeding the developer from the respective nozzles onto the resist film while rotating the base plate and while scanning the nozzle arm over the resist film so that the scan covers at least the surface area of the resist film between the axis of rotation of the base plate and the periphery of the resist film.

BRIEF DESCRIPTION OF THE DRAWINGS

The invention is described below in detail with reference to the accompanying drawings, in which.

DESCRIPTION OF THE PREFERRED EMBODIMENTS

Figure 1:
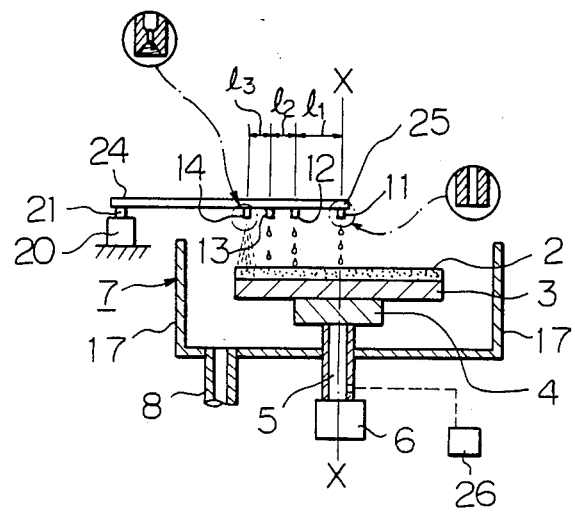
FIG. 1 is a partially sectioned schematic view of a developing apparatus according to the present invention.

The developing apparatus of the present invention has a housing 7 which receives therein a base plate 3, such as a silicone wafer. The base plate 3 has a resist film, such as a photoresist film 2 coated on its upper surface. The base plate 3 is supported on a support base 4 which is, for example, held on a vacuum suction chuck device 5. The vacuum device 5 is connected to a vacuum source, such as a vacuum pump 26, so that the support base 4 can be firmly and detachably held by the vacuum device 5.

The vacuum device 5 is also connected to a motor 6 so that the vacuum device 5 can be rotated by the motor 6 about a vertical axis X—X which crosses the center 0 of the base plate 3. When the motor 6 rotates, the base plate 3 can be rotated, together with the support base 4, about the axis X—X. The housing 7 has a peripheral side wall 17 which is adapted to collect the developer scattered or removed from the base plate 3, explained hereinafter. The collected developer (liquid) flows to the bottom of the housing 7 and is discharged therefrom through a discharge port 8 provided on the bottom of the housing 7.

Figure 2:
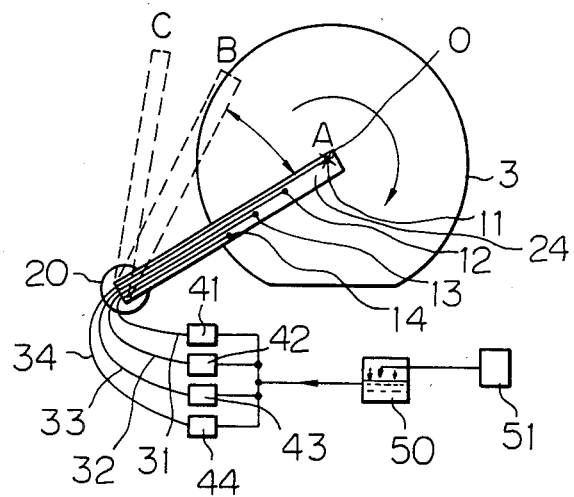
FIG. 2 is a schematic plan view of the apparatus shown in FIG. 1.

According to the present invention, a nozzle arm 24 which has a plurality of nozzles 11, 12, 13, and 14 is provided and extends over the base plate 3. The number of nozzles is not limited to four and may be more or less than four. The nozzles are arranged on the nozzle arm 24 along the length of the nozzle arm 24. The nozzle arm 24 extends at least to the center of the base plate 3 (i.e. of the resist film 2), which is generally circular with a partial flat portion, from the periphery thereof. In practice, the nozzle arm 24 extends from the outside of the housing 7 to the center 0 of the base plate 3. The nozzle arm 24 is preferably connected at its base end to a drive shaft 21 of a motor 20 so that the nozzle arm 24 can swing about the drive shaft 21 over the base plate 3, as is shown in FIG. 2. That is, the free end 25 of the nozzle arm 24 can move between the center of the base plate 3 and the periphery thereof or the outside of the base plate over the base plate. In the illustrated embodiment, the nozzle arm 24 moves between a first position A, in which the outermost nozzle 11 of the nozzle arm 24 is substantially located above the center 0 of the base plate 3 (and, accordingly, of the resist film 2), and a second position C, in which the outermost nozzle 11 is located outside of the base plate 3. An intermediate position B connotes that the outermost nozzle 11 is located substantially above the peripheral edge of the resist film 2. The innermost nozzle 14 is located over the peripheral edge of the resist film 2 in the first position A.

The nozzles 11, 12, 13, and 14 are connected to respective feed pipes 31, 32, 33, and 34 which are connected to a common developer reservoir 50, preferably through respective developer controllers 41, 42, 43, and 44. The developer controllers known per se independently control the amount of developer fed from the respective nozzles.

Figure 3:
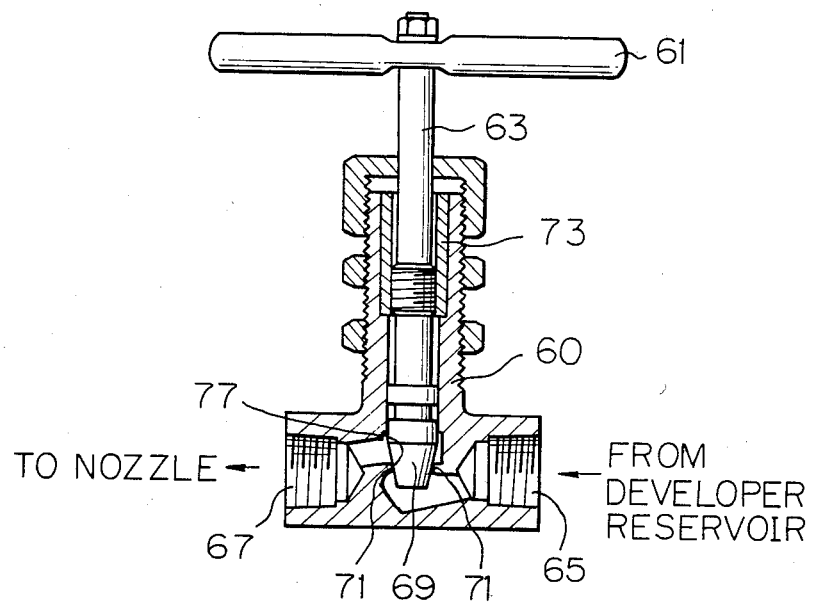
FIG. 3 is a longitudinal sectional view of one example of a developer controller used in the present invention.

FIG. 3 shows one example of the developer controllers 41, 42, 43, and 44. In FIG. 3, the controller is in the form of a flow control valve which is well known per se and which has a valve body 60 in which a needle valve 71 is slidably arranged. The needle valve 71 has a shaft 63 with an outer threaded portion which is screw-engaged in an inner threaded portion of a sleeve 73 which is rigidly held in the valve body 60. The shaft 63 is connected at its top to a handle 61 which is adapted to rotate the shaft 63. When the shaft 63 rotates, the needle valve 69 integral with the shaft 63 moves up and down in FIG. 3 due to a screw engagement between the sleeve 73 and the shaft 63. The movement of the needle valve 69 controls the cross-sectional area of a valve port 77 which is defined by a valve seat 71 of the valve body 60 so that the flow rate of the developer which passes through the valve port 77 from a valve inlet 65 connected to the developer reservoir 50 (FIG. 2) to a valve outlet 67 connected to the corresponding nozzle 11, 12, 13, or 14, can be controlled.

The developer controllers are not limited to a needle-type control valve as is illustrated in FIG. 3 but may be of any type of flow control or regulating valve.

The nozzles 11, 12, 13, and 14 are preferably arranged at different distances $l_1$, $l_2$, $l_3$ from each other on the nozzle arm 24; i.e., in such a way that the distance between adjacent nozzles is less the nearer these nozzles are to the peripery of the resist film. Namely, in the illustrated embodiment, $l_1 > l_2 > l_3$.

The difference in distance between the nozzles contributes to control of the amount of developer fed onto the resist film 2. That is, the small distance between the nozzles near the periphery of the base plate enables a larger amount of developer to be fed onto the surface portion of the resist film that is located near the periphery thereof, in comparison with the surface portion of the resist film that is located near the center thereof where the distance between the nozzles is larger.

Therefore, by arranging the nozzles non-equidistantly, the developer controllers 41, 42, 43, and 44 can be dispensed with, because the amount of developer fed onto the surface area of the resist film can be adjusted in accordance with the difference in distance between adjacent nozzles. It is also possible to provide developer controllers in order to finely adjust the amount of developer to be discharged from the respective nozzles.

Alternatively, it is also possible to arrange the nozzles equidistantly along the length of the nozzle arm 24. In such a case, in which $l_1 = l_2 = l_3$, the amount of developer discharged from the nozzles can be independently controlled by the respective developer controllers.

The nozzles are either indentical in or not indentical in diameter or in shape.

Furthermore, the nozzles all may be in the form of simple tubes for enabling the developer to drop therfrom, as is illustrated in the enlarged partial view in FIG. 1. Alternatively, some of or all of the nozzles may be spray nozzles for spraying the developer at a predetermined spread angle, as is illustrated in the enlarged partial view in FIG. 1. In the illustrated embodiment in FIG. 1, only the nozzle 14 is a spray nozzle, and the other nozzles 11, 12, and 13 are indentical developer-droping nozzles. Preferably, the developer in the developer reservoir 50 is pressurized by, for example, a gas pump, such as a $N_2$ gas pump 51, so that the developer is continuously under a constant pressure, e.g., 1.2 atm., in the developer reservoir 50.

The developing apparatus as constructed above operates as follows. The base plate 3 is rotated, for example, at from 500 to 1,000 rpm by the motor 6. The nozzle arm 24, which is in its initial position C, begins swinging about the axis of the shaft 21 of the motor 20 toward the first position A due to the operation of the motor 20. When the nozzle arm 24 swings, the developer is fed from the respective nozzles 11, 12, 13, and 14. The amount of developer fed onto the surface area of the resist film 2 is predetermined in accordance with the distance between the nozzles, as was previously mentioned. Namely, the amount of developer fed onto the surface area portion of the resist film that is located near the periphery of the resist film is larger than that fed onto the surface area portion of the resist film in the vicinity of the center of the resist film.

It is also possible to finely adjust the amount of developer discharged from the nozzles with the respective developer controllers 41, 42, 43, and 44, in accordance with the state of developing, as mentioned before.

The nozzle arm 24 moves, for example, one and a half strokes, i.e., the positions C→B→A→B→C→B→A. Theoretically, one movement of the nozzle arm 24 between the positions A and B is sufficient.

During the movement of the nozzle arm 24, the developer is continuously dropped or is sprayed from the respective nozzles onto the resist film 2. The feeding of the developer onto the resist film which rotates at a rather high speed is mainly effected for the purpose of improving the hydrophilic property. That is, the developer itself contributes very little to the developing of the resist film at this stage.

After the nozzle arm 24 moves to the position A for the second time, the rotational speed of the base plate 3 is reduced so that the base plate 3 rotates at, for example, 40 rpm only by one turn.

During this one turn of the base plate 3 at a reduced speed, the developer continues to be fed from the nozzles. Thus, the developer can be fed over all of the resist film in such a way that the amount of developer per unit surface area of the resist film is the same at every surface portion of the resist film. This results in stable and uniform developing of the resist film.

After one turn of the base plate 3 at a reduced speed is completed, the rotation of the base plate 3 and the feeding of the developer from the nozzles are stopped. The nozzle arm 24 is returned to the initial position C, if necessary.

The developing is completed a predetermined time after the rotation of the base plate 3 is stopped and a predetermined time after feeding of the developer is stopped. If necessary, after the completion of developing, the resist film is washed with water to remove the portion of the resist film other than the desired pattern portion, the water flowing out through the discharge port 8 of the housing 7.

Figure 4A:
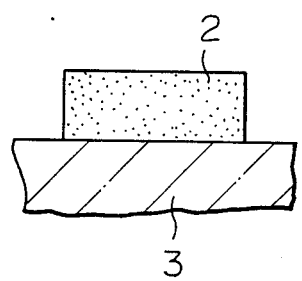
FIGS. 4A and 4B are enlarged partial views of a resist pattern formed on a base plate, showing a disadvantage of the prior art.
Figure 4B:
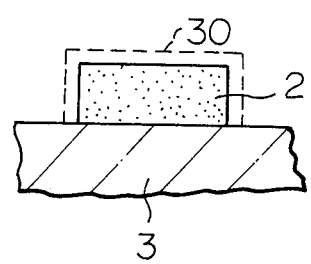

FIGS. 4A and 4B show an irregularity in the thickness of and the width of a developed photoresist film pattern according to the prior art.

FIG. 4A shows a developed resist portion near the periphery of the base plate, and FIG. 4B shows a developed resist portion near the center of the base plate. As can be seen from FIGS. 4A and 4B, and as was previously mentioned, according to the prior art, the thickness of and the width of the developed photoresist pattern are not uniform due to a difference in the surface area of the photoresist film 2 between the portion near the periphery of and the portion near the center of the resist film. Namely, the thickness of and the width of the developed resist film at the periphery are larger than those at the center since the surface area of the periphery of the resist film is larger than that of the center of the resist film. In FIG. 4B, an imaginary line 30 shows an overdeveloped portion in the vicinity of the center of the photoresist film 2.

However, the present invention is free from the above-mentioned drawback shown in FIGS. 4A and 4B. That is, according to the present invention, as can be understood from the above discussion, a proper arrangement of a plurality of nozzles and a proper adjustment of the amount of developer fed from the nozzles enable uniform and stable developing of the photoresist film, resulting in the production of a high-quality photoresist pattern.

Namely, according to the present invention, the developed photoresist film is uniform in thickness and width over the entire surface thereof. That is, in the present invention, the photoresist film pattern even in the vicinity of the center thereof is as is shown in FIG. 4A, which shows the photoresist film pattern in the vicinity of the periphery of the photoresist film.

I claim:

1. A method for developing a resist film coated on a rotatable base plate with a developer which is fed from a plurality of nozzles arranged on a nozzle arm along the length of the nozzle arm, said nozzle arm extending over the resist film, comprising feeding the developer from the respective nozzles onto the resist film while rotating the base plate and while scanning the nozzle arm in a plane parallel to the base plate, over the resist film so that the scan covers at least the surface area of the resist film between the axis of rotation of the base plate and the periphery of the resist film.

2. A method according to claim 1, further comprising independently controlling the amount of developer fed from the respective nozzles.

3. An apparatus for developing a resist film coated on a base plate, the apparatus comprising means for rotatably supporting the base plate, means for rotating said base plate, and a nozzle means for feeding a developer onto the resist film, said nozzle means comprising a nozzle arm means which extends over the base plate and a plurality of nozzles arranged along the length of said nozzle arm means, said nozzle arm means being movable over said base plate in a plane substantially parallel to the surface of the said base plate between a first position extending along the periphery of said base plate and a second position extending over the center of said base plate, wherein said plurality of nozzles feeds a developer onto said base plate as said nozzle arm means moves between the first and second positions.

4. An apparatus according to claim 3, further comprising means for moving the nozzle arm means between the axis of rotation of the base plate and the periphery thereof.

5. An apparatus according to claim 3, further comprising means for independently controlling the amount of developer fed from the respective nozzles.

6. An apparatus according to claim 3, wherein said nozzles are arranged equidistantly along the length of the nozzle arm means.

7. An apparatus according to claim 3, wherein said nozzles are arranged so that the distance between adjacent nozzles is less the nearer these nozzles are to the periphery of the resist film.

8. An apparatus according to claim 3, said nozzles comprising indentical developer-dropping nozzles.

9. An apparatus according to claim 3, wherein said nozzles comprise at least one spray nozzle.

10. An apparatus for developing a resist film coated on a rotatable base plate, the apparatus comprising means for rotatably supporting the base plate, means for rotating the base plate, nozzle means for feeding a developer onto the resist film, said nozzle means comprising a nozzle arm which extends over the base plate and which has a plurality of nozzles arranged along the length of the nozzle arm, and means for independently controlling the amount of developer fed from the respective nozzles.

11. An apparatus for developing a resist film coated on a rotatable base plate, the apparatus comprising means for rotatably supporting the base plate, means for rotating the base plate, and nozzle means for feeding a developer onto the resist film, said nozzle means comprising a nozzle arm which extends over the base plate and which has a plurality of nozzles arranged along the length of the nozzle arm, wherein said nozzles are arranged so that the distance between adjacent nozzles is less the nearer these nozzles are to the periphery of the resist film.

* * * * *